United States Patent [19]

Yamada et al.

[11] Patent Number: 5,036,263
[45] Date of Patent: Jul. 30, 1991

[54] PIEZOELECTRIC ACTUATOR DRIVING APPARATUS

[75] Inventors: Yasufumi Yamada, Okazaki; Yasutaka Nakamori, Anjo; Kiyomitsu Kozawa, Nagoya; Yoshimi Natsume, Toyokawa, all of Japan

[73] Assignee: Nippondenso Co., Ltd., Kariya, Japan

[21] Appl. No.: 432,677

[22] Filed: Nov. 7, 1989

[30] Foreign Application Priority Data

Nov. 9, 1988 [JP] Japan .................. 63-283394

[51] Int. Cl.⁵ .......................................... H01L 41/08
[52] U.S. Cl. ...................................... 318/116; 310/316
[58] Field of Search .......................... 310/316-319; 318/116, 118; 239/584, 585; 123/446, 478, 490, 498

[56] References Cited

U.S. PATENT DOCUMENTS

| | | | |
|---|---|---|---|
| 4,109,174 | 8/1978 | Hodgson | 310/316 |
| 4,520,289 | 5/1985 | Sato et al. | 310/316 |
| 4,644,212 | 2/1987 | Moritugu | 310/316 X |
| 4,705,003 | 11/1987 | Sakakibara et al. | 310/317 X |
| 4,732,129 | 3/1988 | Takigawa et al. | 310/316 X |
| 4,749,897 | 6/1988 | Natsume et al. | 310/317 |
| 4,767,959 | 8/1988 | Sakakibara et al. | 310/316 X |

FOREIGN PATENT DOCUMENTS

| | | |
|---|---|---|
| 52-125316 | 10/1977 | Japan . |
| 58-64077 | 4/1983 | Japan . |
| 59-77043 | 5/1984 | Japan . |
| 59-221437 | 12/1984 | Japan . |
| 61-98165 | 5/1986 | Japan . |
| 62-210241 | 9/1987 | Japan . |
| 63-97854 | 4/1988 | Japan . |
| 63-107077 | 5/1988 | Japan . |

Primary Examiner—Mark O. Budd
Attorney, Agent, or Firm—Cushman, Darby & Cushman

[57] ABSTRACT

Disclosed is a piezoelectric actuator driving apparatus in which a piezoelectric element used to operate as an electro-mechanical transducer is suitably charged and discharged so that the piezoelectric element can make a predetermined amount of mechanical displacement. In the apparatus, the energy of electric charge causing expansion of the piezoelectric element is controlled by a plurality of pulse signals. Each of these pulse signals acts to store electric charge having a predetermined amount of energy in a capacitor, so that the amount of electric charge stored in the capacitor increases with the increase in the number of the pulse signals. After the total amount of the energy of the electric charge stored in the capacitor attains a predetermined value sufficient to cause expansion of the piezoelectric element, the electric charge stored in the capacitor is supplied to the piezoelectric element. Thus, even when a high speed response and high energy are demanded for controlling the amount of expansion of the piezoelectric element, this demand can be readily dealt with. On the other hand, when the electric charge stored in the piezoelectric element is discharged, voltages applied to the piezoelectric element and the primary and secondary windings of a transformer are controlled so as to prevent deterioration of the piezoelectric element.

6 Claims, 5 Drawing Sheets

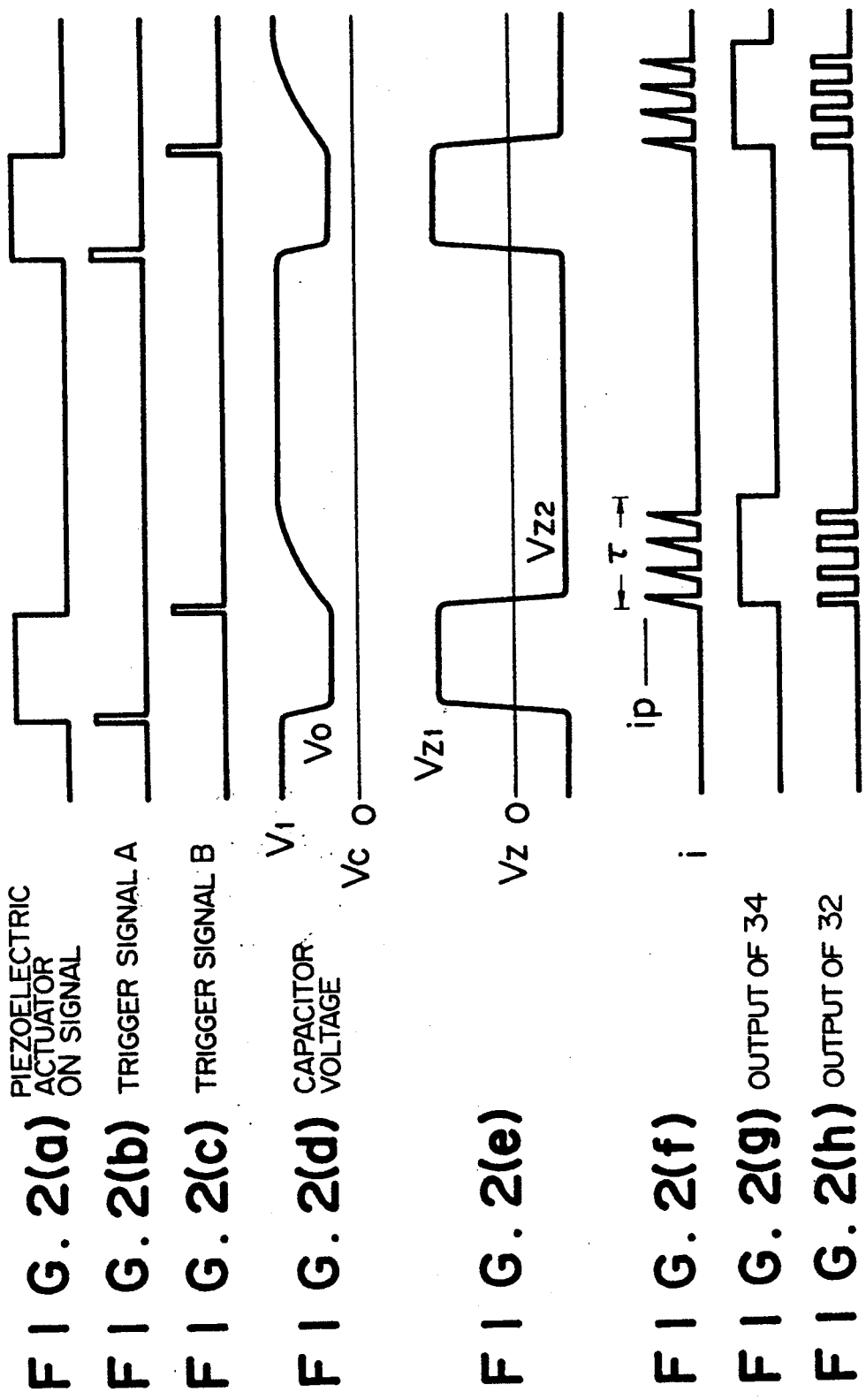

FIG. 3(a)   Cz=Cz1
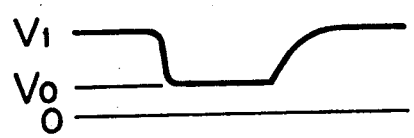
FIG. 3(b)   Cz=Cz2
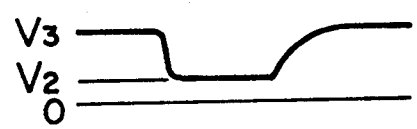
FIG. 4(a) TRIGGER SIGNAL A
FIG. 4(b) TRIGGER SIGNAL B
FIG. 4(c)
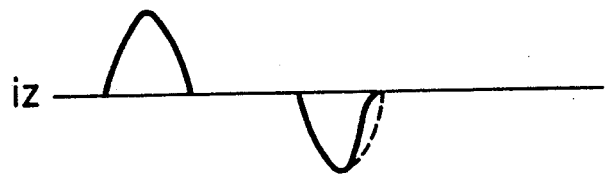
FIG. 4(d)
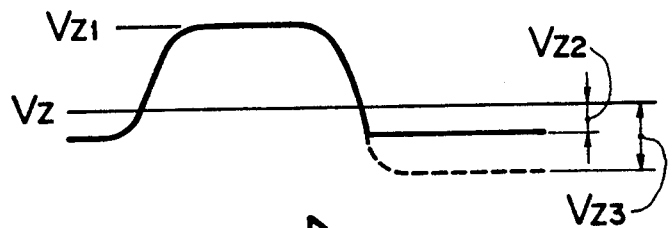
FIG. 4(e)
FIG. 4(f)

PIEZOELECTRIC ACTUATOR DRIVING APPARATUS

BACKGROUND OF THE INVENTION

This invention relates to an apparatus for driving a piezoelectric actuator including a piezoelectric element used as an electro-mechanical transducer, and more particularly to an apparatus of the kind described above in which the piezoelectric element is suitably charged and discharged so that the piezoelectric element can make a predetermined amount of mechanical displacement.

Various kinds of actuators utilizing a piezoelectric element have been proposed hitherto. This is because the piezoelectric element has various marked advantages including a small size, low power consumption and high speed responsiveness. In this connection, various kinds of circuits for driving such a piezoelectric actuator have also been proposed hitherto. For example, JP-A-62-210241 (the publication of one of the priority applications for U.S. Pat. No. 4,749,897) describes that, in view of the fact that a piezoelectric element has a large temperature coefficient, the mechanical displacement of the piezoelectric element can be controlled to be maintained constant independently of the temperature when the amount of electrostatic energy stored in the piezoelectric element is maintained constant. According to the disclosure of JP-A-62-210241 which intends to control the mechanical displacement of the piezoelectric element to the desired target value, the amount of energy stored in a transformer is controlled so as to control the mechanical displacement of the piezoelectric element on the basis of the energy stored in the transformer. Also, JP-A-58-64077 discloses an apparatus in which a coil is connected to an electrostrictive element (a piezoelectric element) to form a resonance circuit, and electric power stored once in the piezoelectric element is returned by the function of this resonance circuit toward a power source, thereby minimizing the power consumption.

However, in the case of JP-A-62-210241 cited above, in which the energy stored in the transformer is used to directly charge the piezoelectric element thereby controlling the mechanical displacement of the piezoelectric element, the transformer is required to be very large in size so that it can store a large amount of energy when a high speed response and high energy are demanded for controlling the displacement of the piezoelectric element.

FIG. 5 is a graph showing the voltage-displacement characteristic of such a piezoelectric actuator. In order that the piezoelectric actuator can make maximum expansion and contraction, it is preferable that the piezoelectric element operates at a voltage between points A and B in FIG. 5 relative to the hysteresis curve of the piezoelectric element.

Also, in the case of JP-A-58-64077 cited above, in which the resonance circuit is used to minimize the power consumption, a negative voltage is induced in the piezoelectric element when the electric charge stored once in the piezoelectric element is returned toward the power source by the resonance circuit, and the value of this negative voltage is determined by both the value of a positive voltage applied to the piezoelectric element and the constants of the resonance circuit. Thus, a change in the value of the positive voltage applied to the piezoelectric element results in a great change in the value of the negative voltage induced in the piezoelectric element. Therefore, the hysteresis curve of the piezoelectric element will differ in each operation cycle, with the result that the displacement of the piezoelectric element may not be controlled to the desired target value or may become unstable. Also, there arises such a problem that undesirable deterioration of the piezoelectric element will be accelerated when a negative voltage higher than the voltage at the point B in FIG. 5 is applied to the piezoelectric element.

SUMMARY OF THE INVENTION

In view of various problems experienced with the prior art apparatuses described above, it is an object of the present invention to provide a piezoelectric actuator driving apparatus in which a piezoelectric element is suitably charged and discharged so as to obviate all of the drawbacks of the prior art apparatuses.

In accordance with one aspect of the present invention which attains the above object, there is provided an apparatus for driving a piezoelectric actuator, comprising: a charging route for selectively supplying electric charge to a piezoelectric element so as to cause expansion of the piezoelectric element; a discharging route for selectively discharging the electric charge supplied to the piezoelectric element so as to cause contraction of the piezoelectric element; a charging transformer having its primary winding connected to a power source and its secondary winding, excited by the primary winding, connected to the charging route so that, when the primary winding is disconnected from the power source, magnetic energy stored in the primary winding induces a voltage in the secondary winding; a switching element connected between the primary winding of the transformer and the power source so as to disconnectably connect the primary winding to the power source; a capacitor connected in parallel with the charging route through a rectifier element so as to be charged with the voltage induced in the secondary winding of the transformer; drive means for discontinuously driving the switching element by a plurality of continuous pulse signals so as to charge the capacitor with electric charge having a predetermined amount of energy; and charge supplying means for supplying, after the capacitor is charged with the electric charge having the predetermined amount of energy, the electric charge to the piezoelectric element.

In accordance with another aspect of the present invention, there is provided an apparatus for driving a piezoelectric actuator, comprising: a charging route for selectively supplying electric charge to a piezoelectric element so as to cause expansion of the piezoelectric element; a discharging route for selectively discharging the electric charge supplied to the piezoelectric element so as to cause contraction of the piezoelectric element; a discharging transformer having its primary winding connected in the discharging route and its secondary winding excited by the primary winding, the primary winding and the secondary winding having a predetermined turns ratio; and secondary voltage limiting means connected to the secondary winding of the transformer for limiting the voltage induced in the secondary winding to a predetermined value.

According to the apparatus of the present invention having the structure described above, the energy of the electric charge causing the expansion of the piezoelectric element is controlled by the plural pulse signals.

Under control of each of these plural pulse signals, the capacitor stores electric charge having a predetermined amount of energy, and the amount of electric charge stored in the capacitor increases in proportion to the number of the pulse signals. After the total amount of the energy of the electric charge stored in the capacitor attains a predetermined value sufficient for causing the expansion of the piezoelectric element, the electric charge stored in the capacitor is supplied to the piezoelectric element. Thus, even when a high speed response and high energy are demanded for controlling the amount of expansion of the piezoelectric element, such a demand can be readily dealt with. Also, because the capacitor is charged with electric charge having the predetermined amount of energy each time each pulse signal is applied, that is, because the total amount of electric charge stored in the capacitor is successively increased by sequential application of the pulse signals, even a charging transformer of small size can be satisfactorily used to supply the required amount of electric charge having high energy to the piezoelectric element. Because, at the same time, the amount of energy of the electric charge that can be stored in the capacitor is controlled by the number of the pulse signals, the total amount of energy can be easily controlled.

Further, when the electric charge stored in the piezoelectric element is discharged, the piezoelectric element and the primary winding of the discharging transformer form a resonance circuit. In this case, the voltage applied across the primary winding of the transformer changes to cause a corresponding change in the voltage induced in the secondary winding. This voltage induced in the secondary winding of the transformer is limited to a predetermined value by the secondary voltage limiting means.

Thus, the voltage applied across the primary winding of the discharging transformer is also maintained at a predetermined value by the combination of the pre-set turns ratio between the primary and secondary windings and the value of the predetermined voltage induced in the secondary winding. Further, because the value of the voltage applied across the piezoelectric element is the same as that of the voltage applied across the primary winding of the discharging transformer, the voltage across the piezoelectric element is also maintained at a predetermined value. Therefore, the hysteresis curve drawn by the piezoelectric element can be stabilized, so that undesirable deterioration of the piezoelectric element can be prevented.

It will be seen from the above description that, according to the present invention, charge-discharge of the piezoelectric element is suitably controlled so that the amount of expansion of the piezoelectric element can be controlled to a predetermined value regardless of any change in the temperature. Also, according to the present invention, the piezoelectric element can be controlled to operate with a high speed response and with high energy even when a charging transformer of small size is used. Further, according to the present invention, the piezoelectric element can make maximum mechanical displacement without being deteriorated.

BRIEF DESCRIPTION OF THE DRAWINGS

FIGS. 2(a) to 2(h) show operating waveforms appearing at various parts of the embodiment shown in FIG. 1.

FIGS. 3(a) and 3(b) illustrate the operation of the embodiment shown in FIG. 1.

FIGS. 4(a) to 4(f) show also operating waveforms appearing at various parts of the embodiment shown in FIG. 1.

DESCRIPTION OF THE PREFERRED EMBODIMENTS

A first embodiment of the present invention will now be described in detail with reference to FIGS. 1, 2, 3, 4 and 5.

Figure 1:
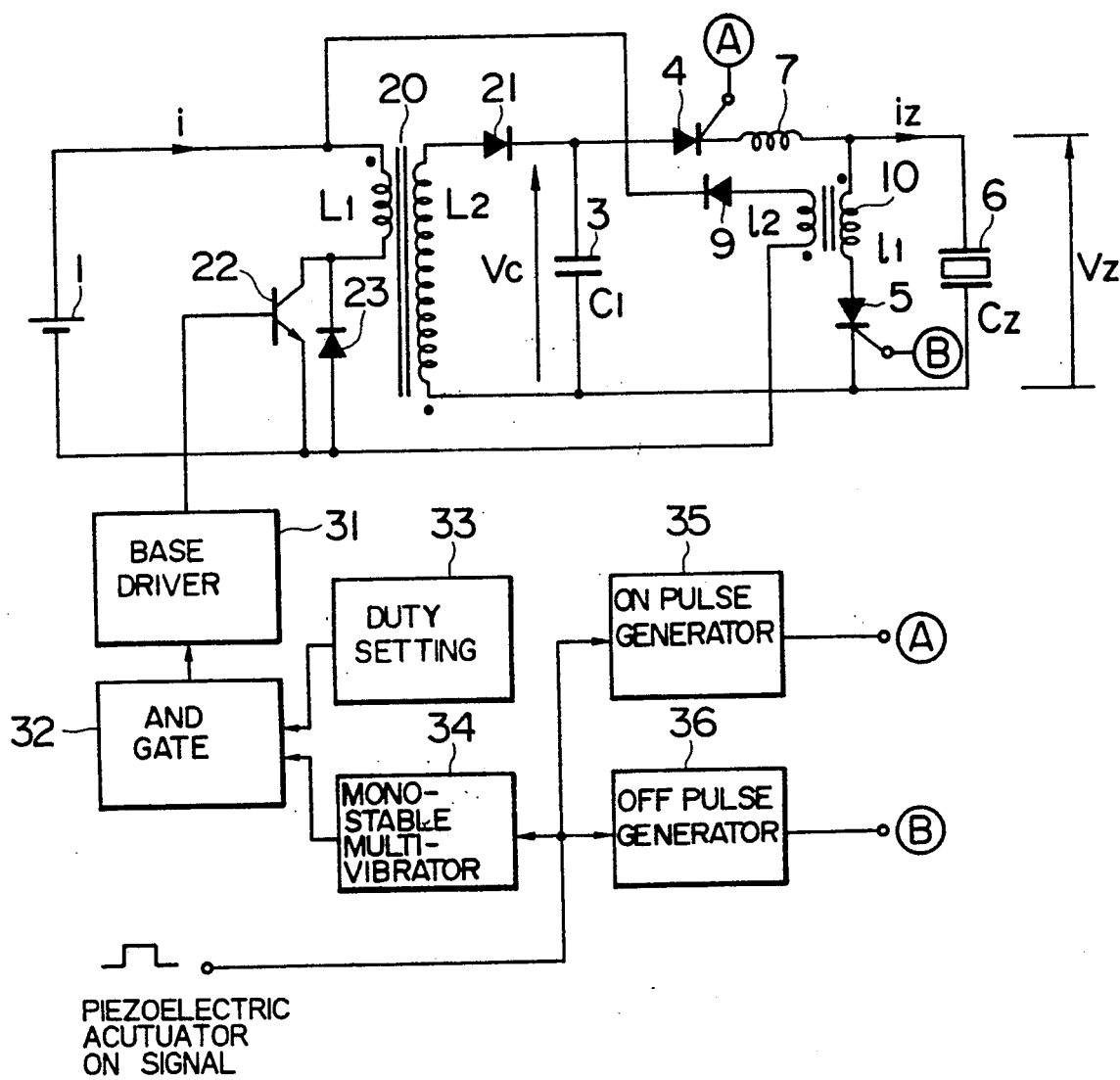
FIG. 1 is a block circuit diagram showing the structure of a preferred embodiment of the present invention.

Referring to FIG. 1, the apparatus includes a d.c. power source 1. A transformer 20 acting as a charging transformer is connected at one end of its primary winding $L_1$ to the positive terminal of the power source 1 and at the other end of its primary winding $L_1$ to the collector of a transistor 22 which is a switching element. The transistor 22 is connected at its emitter to the negative terminal of the power source 1. The d.c. power source 1 is electrically connected to the primary winding $L_1$ of the transformer 20 when the transistor 22 is driven by an output signal of a known base drive circuit 31 connected to the base of the transistor 22. A diode 23 is connected in parallel to the transistor 22 so as to limit a reverse voltage that may be applied to the transistor 22. The transformer 20 is connected at one end of its secondary winding $L_2$ to the anode of a diode 21. The diode 21 is connected at its cathode to the positive terminal of a capacitor 3 and also to the anode of a thyristor 4 acting as a charge supplying means. The capacitor 3 is connected at its negative terminal to the other end of the secondary winding $L_2$ of the transformer 20. Thus, the power supply voltage boosted by the transformer 20 is applied across the capacitor 3, thereby charging the capacitor 3 with electric charge having a predetermined amount of energy. The thyristor 4 is connected at its cathode to one end of a reactor 7, and the reactor 7 is connected at the other end to the positive terminal of a piezoelectric actuator 6 which includes a piezoelectric element. The piezoelectric actuator 6 is connected at its negative terminal to the other end of the secondary winding $L_2$ of the transformer 20 together with the negative terminal of the capacitor 3. Thus, when the thyristor 4 is turned on, the electric charge stored in the capacitor 3 is supplied to the piezoelectric actuator 6 thereby causing expansion of the piezoelectric actuator 6. In the arrangement described above, the circuit portions extending from the terminals of the capacitor 3 to the associated terminals of the piezoelectric actuator 6 correspond to the charging route.

A transformer 10 acting as a discharging transformer is connected at one end of its primary winding $l_1$ to the connection point between the reactor 7 and the piezoelectric actuator 6 and at the other end of its primary winding $l_1$ to the anode of a thyristor 5. The thyristor 5 is connected at its cathode to the other end of the secondary winding $L_2$ of the transformer 20 together with the negative terminal of the piezoelectric actuator 6 and the negative terminal of the capacitor 3. Thus, when the thyristor 5 is turned on, the electric charge stored in the piezoelectric actuator 6 is discharged through the transformer 10 and the thyristor 5. The transformer 10 is connected at one end of its secondary winding $l_2$ to the anode of a diode 9, and the diode 9 is connected at its cathode to the positive terminal of the power source 1. The transformer 10 is connected at the other end of its secondary winding $l_2$ to the negative terminal of the power source 1, so that the combination of the power source 1 and the diode 9 functions as a secondary voltage limiting means. In the arrangement described above, the closed circuit extending from the terminals of the piezoelectric actuator 6 to the transformer 10 and the thyristor 5 corresponds to the discharging route. The primary and secondary windings $L_1$ and $L_2$ of the transformer 20 and the primary and secondary windings $l_1$ and $l_2$ of the transformer 10 have respective numbers of turns as schematically shown in FIG. 1.

A signal for turning on the piezoelectric actuator 6 (which signal will be referred to hereinafter as a piezoelectric actuator ON signal) has a waveform as shown in FIG. 2(a), and such an ON signal is applied to an ON pulse generator 35, an OFF pulse generator 36 and a monostable multivibrator 34 shown in FIG. 1. The ON pulse generator 35 is triggered by the leading edge of the piezoelectric actuator ON signal, and its output provides a gate signal A used for turning on the thyristor 4. This gate signal A has a waveform as shown in FIG. 2(b). The OFF pulse generator 36 is triggered by the trailing edge of the piezoelectric actuator ON signal, and its output provides a gate signal B used for turning on the thyristor 5. This gate signal B has a waveform as shown in FIG. 2(c).

The monostable multivibrator 34 is triggered by the trailing edge of the piezoelectric actuator ON signal, and its output pulse signal having a high level maintained for a predetermined period of time $\tau$ as shown in FIG. 2(g) is applied to an AND gate 32. A duty setting circuit 33 sets the duty factor of the signal driving the transistor 22, and its duty output signal is also applied to the AND gate 32. The AND gate 32 drives the base drive circuit 31 only when both the output signal of the monostable multivibrator 34 and that of the duty setting circuit 33 are in their high level. The output signal of the AND gate 32 has a waveform as shown in FIG. 2(h). The output signal of the base drive circuit 31 is applied to the base of the transistor 22 so as to turn on-off the transistor 22.

The operation of the embodiment shown in FIG. 1 will be described with reference to FIGS. 2(a) to 2(h) showing operating waveforms appearing at various parts of FIG. 1. For the purpose of simplicity of description, FIGS. 2(a) to 2(h) show operating waveforms appearing when the transformer 10 is considered merely as a reactor.

First, when the piezoelectric actuator ON signal having the waveform shown in FIG. 2(a) is applied to the ON pulse generator 35, the ON pulse generator 35 is triggered by the leading edge of the piezoelectric actuator ON signal, and the gate signal or triggering signal A having the waveform shown in FIG. 2(b) is generated from the ON pulse generator 35 to turn on the thyristor 4. This triggering signal A is applied to the gate of the thyristor 4 thereby turning on the thyristor 4. At this time, Lc resonance occurs in a closed circuit which is traced from the capacitor 3 through the thyristor 4, the reactor 7 and the piezoelectric actuator 6, and a voltage is applied across the piezoelectric actuator 6. As a result, the terminal voltage $V_z$ of the piezoelectric actuator 6 rises up to a level $V_{zl}$ as shown in FIG. 2(e), and, after the terminal voltage $V_c$ of the capacitor 3 drops from a level $V_1$ to a level $V_0$ as shown in FIG. 2(d), the thyristor 4 is turned off to end the charging operation.

Then, the OFF pulse generator 36 is triggered by the trailing edge of the piezoelectric actuator ON signal, and the triggering signal B having the waveform shown in FIG. 2(c) is generated from the OFF pulse generator 36 to turn on the thyristor 5. This triggering signal B is applied to the gate of the thyristor 5 thereby turning on the thyristor 5. At this time, a closed circuit which is traced from the piezoelectric actuator 6 through the reactor 10 and the thyristor 5 is formed, and resonance occurs in the combination of the piezoelectric actuator 6 and the reactor 10 in this closed circuit, with the result that the terminal voltage $V_z$ of the piezoelectric actuator 6 changes from the positive level $V_{zl}$ to a negative level $V_{z2}$. After this terminal voltage $V_z$ drops from the level $V_{zl}$ to the level $V_{z2}$, the thyristor 5 is turned off to end the discharging operation.

In the meantime, the monostable multivibrator 34 is triggered by the trailing edge of the piezoelectric actuator on signal, and the output signal having its high level maintained for the predetermined period of time $\tau$ as shown in FIG. 2(g) is generated from the monostable multivibrator 34. The duty setting circuit 33 generates its output signal indicative of the pre-set duty factor, and these two output signals from the monostable multivibrator 34 and the duty setting circuit 33 are applied to the AND gate 32. The AND gate 32 generates the duty signal for the predetermined period of time $\tau$ as shown in FIG. 2(h), thereby turning on-off the transistor 22 through the base drive circuit 31. At this time, a current i having a waveform as shown in FIG. 2(f) is supplied to the primary winding $L_1$ of the transformer 20 and to the transistor 22. The total amount of energy E of electric charge stored in the capacitor 3 is given by $$E = \tfrac{1}{2} L_1 \cdot i_p^2 \cdot \eta \cdot f \cdot \tau$$

where $L_1$ is the inductance value of the primary winding of the transformer 20, $i_p$ is the current value when the transistor 22 is turned off, $\eta$ is the efficiency, f is the chopping frequency, and $\tau$ is the period of time during which the capacitor 3 can be charged.

When it is supposed now that the inductance $L_1$ and the efficiency $\eta$ are constant, the energy E is expressed as a function of the current $i_p$, the chopping frequency f and the charging period of time $\tau$. The current $i_p$ and the chopping frequency f are commonly maintained constant in many cases. Thus, the amount of energy E can be controlled by suitably controlling the charging period of time $\tau$, that is, by suitably selecting the number of pulses of the duty signal.

Therefore, when the charging period of time $\tau$ is controlled to be maintained constant, electric charge having a constant amount of energy can be supplied to the capacitor 3 when each pulse of the duty signal is applied. Thus, when the energy of the electric charge stored in the capacitor 3 is supplied to the piezoelectric actuator 6, the amount of expansion of the piezoelectric actuator 6 can be controlled to be maintained constant without regard to any change in the temperature.

Description will now be directed to the reason why the energy supplied to the piezoelectric actuator 6 can be made constant when electric charge having a constant amount of energy is supplied to the capacitor 3 as described above.

FIG. 3(a) shows the case where the electrostatic capacity $C_z$ of the piezoelectric actuator 6 is, for example, $C_{z1}$ at the room temperature of 20° C. When now energy is supplied to the piezoelectric actuator 6 under such a condition, the following differential equation (1) holds:

$$L \cdot \frac{d^2 q}{dt^2} + \frac{1}{C_1} q + \frac{1}{C_z}(q - C_1 V_1) = 0 \quad (1)$$

where q is the amount of electric charge stored in the capacitor 3, $V_1$ is the voltage value at the time, $C_1$ is the electrostatic capacity of the capacitor 3, and L is the inductance value of the reactor 7. By solving the equation (1), the value of the voltage $V_{z1}$ applied across the piezoelectric actuator 6 is calculated as follows:

$$V_{z1} = \frac{2C_1}{C_1 + C_{z1}} V_1 \quad (2)$$

Also, the value of the voltage $V_0$ of the capacitor 3 changes as follows:

$$V_0 = \frac{C_1 - C_{z1}}{C_1 + C_{z1}} V_1 \quad (3)$$

Similarly, FIG. 3(b) shows the case where the electrostatic capacity $C_z$ of the piezoelectric actuator 6 changes to, for example, $C_{z2}$ due to a temperature rise from 20° C. to 100° C. In this case, the value of the voltage $V_{z2}$ applied across the piezoelectric actuator 6 is given by $$V_{z2} = \frac{2C_1}{C_1 + C_{z2}} V_3 \quad (4)$$

and the value of the voltage $V_2$ of the capacitor 3 changes as follows:

$$V_2 = \frac{C_1 - C_{z2}}{C_1 + C_{z2}} V_3 \quad (5)$$

because the amount of energy of the electric charge supplied to the capacitor 3 is maintained constant, the changes in the amounts of energy due to the changes in the voltage of the capacitor 3 are the same in both the case where the temperature is 20° C. and the case where the temperature is 100° C. Thus, the following equation (6) holds:

$$\tfrac{1}{2} C_1(V_1^2 - V_0^2) = \tfrac{1}{2}(V_3^2 - V_2^2) \quad (6)$$

Substitution of the equations (3) and (5) into the equation (6) provides the following equation (7):

$$\frac{1}{2} C_{z1} \left[ \frac{2C_1}{C_1 + C_{z1}} V_1 \right]^2 = \frac{1}{2} C_{z2} \left[ \frac{2C_1}{C_1 + C_{z2}} V_3 \right]^2 \quad (7)$$

Substitution of the equations (2) and (4) into the equation (7) provides the following equation (8):

$$\tfrac{1}{2} C_{z1} V_{z1}^2 = \tfrac{1}{2} C_{z2} V_{z2}^2 \quad (8)$$

Thus, the equation (8) teaches that the value of the left-hand member representing the amount of energy supplied to the piezoelectric actuator 6 at 20° C. is equal to that of the right-hand member representing the amount of energy supplied to the piezoelectric actuator 6 at 100° C.

It will be seen from the above description that the amount of energy supplied to the piezoelectric actuator 6 can be made constant when the amount of energy of the electric charge supplied to the capacitor 3 is maintained constant.

In the embodiment described above, the inductance L of the reactor 7 and the electrostatic capacity C of the capacitor 3 only are considered as the circuit constants, and the resistive components are not taken into consideration. Although there are actually some resistive components, and the amount of energy supplied to the piezoelectric actuator 6 is not always maintained constant in a strict sense, the operation of the apparatus will not be adversely affected by the presence of such resistive components. Further, for example, the capacitance of the capacitor 3 and the resistive components of the circuit are subject to a change as a result of a change in the temperature. However, the temperature coefficient of those components is very small when compared to that of the piezoelectric actuator 6, and its adverse effect is almost negligible. Thus, when the control circuit is located at a place where any appreciable temperature change does not occur, the temperature change itself can be minimized. Further, although the piezoelectric actuator 6 has a resistive component in itself, and all of the equations described above are not directly applicable as a matter of fact, an adverse effect attributable to the resistive component of the piezoelectric actuator 6 is little, and the piezoelectric actuator 6 can be basically driven with a constant amount of energy.

Further, a flyback type d.c.-d.c. converter is used as the charging transformer 10 in the embodiment described above, so that the amount of energy of the electric charge supplied to the capacitor 3 can be easily controlled. This is because, in the case of the transformer 10 in the form of such a d.c.-d.c. converter of flyback type, the electromagnetic energy accumulating in the transformer is entirely free from any adverse effect that may be imparted from the secondary side and can be controlled on the primary side only. On the other hand, when any other converter is used as the transformer 10, it is difficult to control the amount of energy supplied to the capacitor 3, because the amount of energy supplied to the capacitor 3 must be measured for the purpose of control.

The discharging operation on the piezoelectric actuator 6 will now be described with reference to FIGS. 4(a) to 4(f) showing operating waveforms appearing at various parts of FIG. 1.

First, in response to the application of the triggering signal A, shown in FIG. 4(a), to the gate of the thyristor 4, the thyristor 4 is turned on. At this time, LC resonance occurs in the closed circuit which is traced from the capacitor 3 to the capacitor 3 through the thyristor 4, the reactor 7 and the piezoelectric actuator 6, and a current $i_z$ having a waveform as shown in FIG. 4(c) flows through this closed circuit. As soon as this current $i_z$ becomes negative, the thyristor 4 is turned off, and the voltage $V_z$ applied across the piezoelectric actuator 6 rises from the level $V_{z2}$ to the level $V_{z1}$ as shown in FIG. 4(d). Then, when the triggering signal B shown in FIG.

4(b) is applied to the gate of the thyristor 5, the thyristor 5 is turned on, and the electric charge stored in the piezoelectric actuator 6 is discharged through the primary winding l₁ of the transformer 10 and the thyristor 5, thereby causing flow of the current $i_z$ again.

Figure 5:
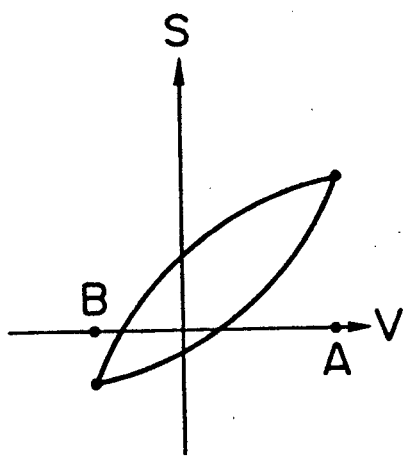
FIG. 5 is a graph showing the voltage-displacement characteristic of the piezoelectric actuator.

Suppose that the transformer 10 is merely a reactor. In this case, the electric charge stored in the piezoelectric actuator 6 is discharged through the reactor 10 and the thyristor 5, and the current $i_z$ flowing now has a waveform as shown by the broken curve in FIG. 4(c). Also, the voltage $V_z$ applied across the piezoelectric actuator 6 drops to a level $V_{z3}$ as shown by the broken curve in FIG. 4(d). The piezoelectric actuator 6 has a voltage-displacement characteristic as shown in FIG. 5. Therefore, in order to cause large displacement of the piezoelectric actuator 6, the voltage $V_z$ applied across the piezoelectric actuator 6 is preferably selected to have a value lying between points A and B shown in FIG. 5. The point A represents a maximum positive voltage applied across the piezoelectric actuator 6, and the point B represents a maximum negative voltage that can be applied across the piezoelectric actuator 6 without deteriorating the piezoelectric actuator 6.

Therefore, in order that a negative voltage induced in the piezoelectric actuator 6 can be limited to a level equal to or lower than the maximum negative voltage described above, a method may be employed according to which a resistor is interposed between the piezoelectric actuator 6 and the thyristor 5. However, even when such a resistor is provided, the negative voltage is still indefinite, resulting in non-stable displacement of the piezoelectric actuator 6. This is because the negative voltage induced in the piezoelectric actuator 6 is determined depending on the positive voltage having been applied across the piezoelectric actuator 6 before the thyristor 5 is triggered and also depending on the circuit constants including the resistance value of the resistor.

On the other hand, the problem pointed out above is solved in the present embodiment by the employment of the transformer 10 in lieu of the reactor.

That is, as soon as the current $i_z$ shown in FIG. 4(c) attains its negative peak, the level of the voltage $V_L$ in the primary winding l₁ of the transformer 10 shifts from positive to negative as shown by the solid curve in FIG. 4(e) and then increases in the negative direction as shown by the broken curve. When the voltage $V_L$ in the primary winding l₁ of the transformer 10 attains the level $V_{z2}$ determined by the following equation:

$$V_{z2} = E \cdot \frac{N_1}{N_2}$$

where N₁ and N₂ are the numbers of turns of the primary and secondary windings l₁ and l₂ respectively of the transformer 10, and E is the power supply voltage, the voltage induced in the secondary winding l₂ of the transformer 10 tends to exceed the power supply voltage E. As a result, the diode 9 is turned on, and a regenerative current $i_B$ having a waveform as shown in FIG. 4(f) starts to flow. Therefore, the voltage $V_L$ in the primary winding l₁ of the transformer 10 is clamped at $$V_L = V_{z2} = E \cdot \frac{N_1}{N_2},$$

and the current $i_z$ is sharply attenuated thereby increasing the current $i_B$ flowing on the secondary side of the transformer 10. Thus, part of the energy stored in the piezoelectric actuator 6 is returned toward the power source 1, and the voltage $V_z$ applied across the piezoelectric actuator 6 is also limited to the level $V_{z2}$.

As a consequence, the negative voltage induced in the piezoelectric actuator 6 is limited to the level $$V_{z2} = E \cdot \frac{N_1}{N_2}$$

even when a variation may occur in the positive voltage $V_{z1}$ having been applied across the piezoelectric actuator 6. Thus, when the power supply voltage E and the numbers of turns N₁ and N₂ of the primary and secondary windings l₁ and l₂ respectively of the transformer 10 are determined so that the level of the voltage $V_{z2}$ becomes equal to that of the voltage at the point B in FIG. 5, the voltage $V_{z2}$ can always be fixed at the operating point B in FIG. 5. Therefore, the piezoelectric actuator 6 can make its maximum displacement without causing any deterioration of the piezoelectric element.

Figure 7:
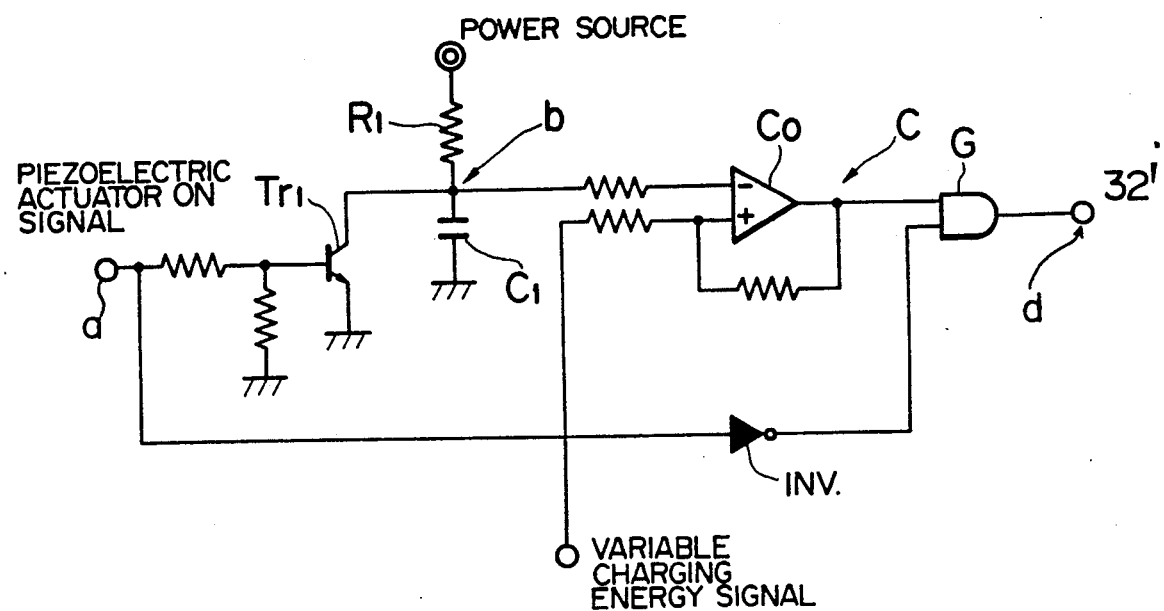
FIG. 7 is a circuit diagram showing the structure of part of a second embodiment of the present invention.

A second embodiment of the present invention will now be described. In the first embodiment described above, the amount of energy of electric charge stored in the capacitor 3 is controlled to be maintained constant so that the amount of expansion of the piezoelectric actuator 6 can be controlled to be maintained constant. In contrast, in the second embodiment, the charging period of time τ, that is, the number of pulses of the duty signal is controlled so that the piezoelectric actuator 6 can make any desired amount of expansion. For this purpose, a circuit having a structure as shown in FIG. 7 is employed in this second embodiment to replace the monostable multivibrator 34 shown in FIG. 1. Other circuit parts and their arrangement are similar to those shown in FIG. 1, and any detailed description of such parts and arrangement will be unnecessary.

Figure 8A:
FIGS. 8(a) to 8(d) show operating waveforms appearing at various parts of the embodiment shown in FIG. 7.
Figure 8B:
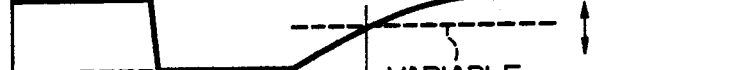
Figure 8C:
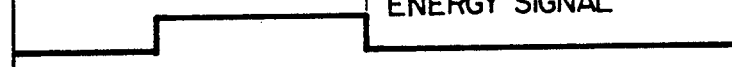
Figure 8D:

The operation of the second embodiment will now be described with reference to FIGS. 7 and 8(a) to 8(d). When now the piezoelectric actuator ON signal shown in FIG. 8(a) is applied to an input terminal a, a transistor $T_{r1}$ is turned on to connect a point b to ground. This point b is connected to a minus input terminal of a comparator CO, while a variable charging energy signal having a predetermined level is applied to a plus input terminal of the comparator CO. As a result, an output signal of high level is generated from the comparator CO, that is, a high potential appears at a point c as shown in FIG. 8(c). This point c is connected to one input terminal of an AND gate G, while the piezoelectric actuator ON signal is applied through an inverter INV to the other input terminal of the AND gate G. Therefore, when the piezoelectric actuator ON signal is in its high level, an output signal of low level as shown in FIG. 8(d) appears at an output terminal d of the AND gate G. Then, when the piezoelectric actuator ON signal is turned into its low level, an output signal of high level as shown in FIG. 8(d) appears at the output terminal d of the AND gate G. Also, because the transistor $T_{r1}$ is turned off at this time, the potential at the point b rises according to the time constant determined by the resistance of a resistor R₁ and the capacitance of a capacitor C₁, as shown in FIG. 8(b). When this potential at the point b becomes higher than the level of the variable charging energy signal, an output signal of low level appears from the comparator CO, and an output signal of low level appears also at the output terminal d of the AND gate G. Thus, by changing the level of the variable charging energy signal, the charging period of time $\tau$ can be correspondingly changed, so that the amount of energy of electric charge stored in the capacitor 3 can be controlled to any desired value.

In the above description, the amount of energy of electric charge supplied to the capacitor 3 is controlled by controlling the charging period of time $\tau$, that is, by controlling the number of pulses of the duty signal. However, the number of pulses of the duty signal may be fixed, and the amount of energy of electric charge supplied to the capacitor 3 may be controlled by controlling the current ip flowing through the primary winding $L_1$ of the charging transformer 20 or by controlling the chopping frequency f. FIGS. 8(a) to 8(d) show operating waveforms appearing at the points a to d respectively in the circuit shown in FIG. 7.

In the aforementioned embodiments, the charging operation is started immediately after an OFF pulse is generated from the OFF pulse generator 36, when the charging period of time $\tau$ is fixed. However, the charging operation may be started at any time after the thyristor 4 is turned off but before the thyristor 4 is then turned on.

Further, when the discharging route only in the aforementioned embodiments is specifically taken into consideration, the transformer 20 may continuously generate a constant voltage or the charging operation may be stopped when the capacitor 3 is charged up to a predetermined voltage.

Figure 6:
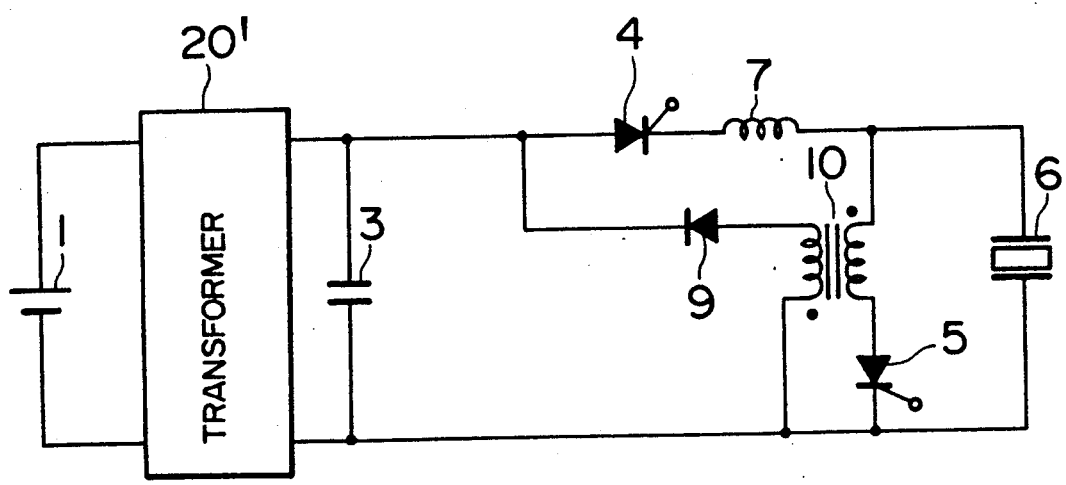
FIG. 6 is a block circuit diagram showing the structure of a modification of the first embodiment of the present invention.

FIG. 6 shows a modification of the first embodiment shown in FIG. 1. Referring to FIG. 6, a transformer 20' is continuously charging the capacitor 3 so that the capacitor 3 is continuously charged to maintain a predetermined voltage. In the modification shown in FIG. 6, the regenerative current produced by the combination of the secondary winding l₂ of the transformer 10 and the diode 9 is returned to the capacitor 3, so that the voltage induced in the secondary winding l₂ of the transformer 10 can be limited to a predetermined value.

We claim:

1. An apparatus for driving a piezoelectric actuator, comprising:
   a charging route for selectively supplying electric charge to a piezoelectric actuator so as to cause expansion of said piezoelectric actuator;
   a charging transformer having its primary winding connected to a power source and its secondary winding which is excited by said primary winding, connected to said charging route, so that magnetic energy stored in said primary winding induces a voltage in said secondary winding;
   a controllable switching element connected between said primary winding of said transformer and said power source so as to controllably connect and disconnect said primary winding to said power source;
   drive means for driving said switching element to connect and disconnect said primary winding to said power source according to a plurality of pulse signals so that when said switching element is driven according to said pulse signals, said primary winding causes magnetic energy stored therein to induce a voltage in said secondary winding at predetermined timings of said pulse signals;
   a capacitor connected to said charging route and in parallel with said secondary winding of said charging transformer so as to be charged with electric charge by said voltage induced in said secondary winding;
   controlling means, coupled to said drive means, for controlling pulses of said drive means to control a total amount of energy of said electric charge to be supplied to said capacitor, based on a desired amount of energy to be supplied to said piezoelectric actuator; and
   said charging route including charge supplying means for switchably supplying said electric charge having restricted energy, controlled by said controlling means, to said piezoelectric actuator.

2. A piezoelectric actuator driving apparatus according to claim 1, wherein said controlling means includes means for discontinuously driving said switching element so as to charge said capacitor with the electric charge having the predetermined amount of energy at a time before actuating said actuator, and for actuating said charge supplying means to supply electric charge to said piezoelectric actuator at a time after the electric charge having the predetermined amount of energy is supplied to said piezoelectric actuator by said charge supplying means.

3. A piezoelectric actuator driving apparatus according to claim 1 further comprising a discharging route, for selectively discharging the electric charge supplied to said piezoelectric actuator so as to cause contraction of said piezoelectric actuator, wherein, in synchronous relation with the discharging operation in which the electric charge supplied to said piezoelectric element is discharged through said discharging route, said drive means starts to discontinuously drive said switching element so as to charge said capacitor with the electric charge having the predetermined amount of energy.

4. A piezoelectric actuator driving apparatus according to claim 1, wherein said drive means includes means for changing at least the number of said pulse signals and/or the chopping frequency thereby controlling the amount of energy of electric charge to be stored in said capacitor.

5. A piezoelectric actuator driving apparatus according to claim 1, wherein said charging transformer is a flyback type DC-DC converter, the magnetic energy stored in said primary winding induces a voltage in said secondary winding, when said primary winding is disconnected from said power source by said switching element.

6. A method of driving a piezoelectric actuator, comprising the steps of:
   selectively connecting a primary winding of a charging transformer to a power source so that magnetic energy stored in said primary winding induces a voltage in a secondary winding of said charging transformer;
   controllably connecting and disconnecting said primary winding to said power source according to a plurality of pulse signals so that when said switching element is driven according to said pulse signals, said primary winding causes magnetic energy stored therein to induce a voltage in said secondary winding at predetermined timings of said pulse signals;
   connecting a charge storing element to said secondary winding of said charging transformer so as to be charged with electric charge by said voltage induced in said secondary winding of said charging transformer;

controlling said pulse signals to control a total amount of energy of said electric charge being supplied to said charge storing element, based on a desired amount of energy to be supplied to said piezoelectric actuator; and switchably supplying said electric charge having restricted energy by said controlling step to said piezoelectric actuator.

* * * * *